US007466527B1

(12) United States Patent
Juang

(10) Patent No.: US 7,466,527 B1
(45) Date of Patent: Dec. 16, 2008

(54) ELECTROSTATIC DISCHARGE PROTECTION CIRCUIT

(75) Inventor: Yih-Cherng Juang, Changhua County (TW)

(73) Assignee: ITE Tech. Inc., Hsinchu (TW)

( * ) Notice: Subject to any disclaimer, the term of this patent is extended or adjusted under 35 U.S.C. 154(b) by 0 days.

(21) Appl. No.: 11/877,681

(22) Filed: Oct. 24, 2007

(30) Foreign Application Priority Data

Jul. 30, 2007   (TW) ............................... 96127757 A

(51) Int. Cl.
  *H02H 9/00* (2006.01)
  *H02H 3/22* (2006.01)
  *H02H 7/12* (2006.01)
  *H02H 1/00* (2006.01)
  *H02H 1/04* (2006.01)
  *H02H 9/06* (2006.01)

(52) U.S. Cl. ........................... 361/56; 361/111; 361/118
(58) Field of Classification Search .................... 361/56, 361/111, 118
See application file for complete search history.

(56) References Cited

U.S. PATENT DOCUMENTS 5,500,546 A * 3/1996 Marum et al. ............... 257/358
6,583,972 B2 * 6/2003 Verhaege et al. ............. 361/56
7,224,949 B2 * 5/2007 Kluge et al. ................ 455/217

\* cited by examiner

*Primary Examiner*—Michael J Sherry
*Assistant Examiner*—Dharti H Patel
(74) *Attorney, Agent, or Firm*—Jianq Chyun IP Office

(57) ABSTRACT

An electro-static discharge protection circuit including a first-LDNMOS transistor, a second-LDNMOS transistor, a first-resistor, and a gate-driven resistance is provided. The drain of the first-LDNMOS transistor is served as an electro-static input end, the P-body and source of the first-LDNMOS transistor are connected to each other. A coupling-voltage signal determines whether the first-LDNMOS transistor is turned on or not. The drain, P-body, and gate of the second-LDNMOS transistor are respectively connected to the drain of the first-LDNMOS transistor, the source of the first-LDNMOS transistor, and a common-ground potential. The first-resistor is connected between the source of the first-LDNMOS transistor and the common-ground potential. One end of the gate-driven resistance is connected to the common-ground potential, the other end of the gate-driven resistance is connected to the source of the second-LDNMOS transistor to generate the coupling-voltage signal, and the coupling-voltage signal is coupled to the gate of the first-LDNMOS transistor.

10 Claims, 3 Drawing Sheets

ELECTROSTATIC DISCHARGE PROTECTION CIRCUIT

CROSS-REFERENCE TO RELATED APPLICATION

This application claims the priority benefit of Taiwan application serial no. 96127757, filed on Jul. 30, 2007. All disclosure of the Taiwan application is incorporated herein by reference.

BACKGROUND OF THE INVENTION

1. Field of the Invention

The present invention relates to a protection circuit, and more particularly to an electrostatic discharge protection circuit.

2. Description of Related Art

Generally speaking, a lateral double diffused NMOSFET (LDNMOS) is used to realize the ESD protection circuit to provide electrostatic protection for power integrated circuit (IC), as shown in FIG. 1. FIG. 1 is a schematic view of a conventional ESD protection circuit and a wiring mode thereof. In FIG. 1, the mark 101 denotes a part of the circuit in an IC chip, and the mark 102 denotes an output pad of an internal circuit signal. The internal circuit of the chip may transmit signals through the output pad 102 of the internal circuit signal. Definitely, the static electricity causes impact on the internal circuit of the chip through the output pad 102 of the internal circuit signal. The mark 103 denotes the ESD protection circuit realized by an LDNMOS transistor 104. It can be known from the figure that the drain 105 of the LDNMOS transistor 104 is connected to the output pad 102 of the internal circuit signal, and the gate, source, and P-body of the LDNMOS transistor 104 are connected to the common ground potential GND.

When the output pad 102 of the internal circuit signal is impacted by a negative ESD, the drain 105 also assumes a negative potential level. The potential level of the drain 105 is lower than that of the P-body of the LDNMOS transistor 104. A PN junction between the P-body and the drain 105 of the LDNMOS transistor 104 is in the forward-bias state, so as to quickly conduct a negative ESD current into the common ground potential GND, and to prevent the internal circuit of the chip from being impacted by the negative ESD. However, when the output pad 102 of the internal circuit signal is impacted by a positive ESD, the potential level of the drain 105 will be higher than that of the P-body of the LDNMOS transistor 104, and the PN junction between the P-body and the drain 105 of the LDNMOS transistor 104 is in the reverse-bias state. Thus, the quick discharge cannot be achieved, and the internal circuit of the chip cannot be effectively protected.

FIG. 2 is a schematic cross-sectional view of a structure of the LDNMOS transistor. In this figure, N+ denotes an N-type highly-doped region, and P+ denotes a P-type highly-doped region. In the two N-type highly-doped regions, the N-type highly-doped region of the drain 201 is located in an N-drift region 209, and the N-type highly-doped region of the source 202 is located in the P-body 210. Marks 203-206 denote a drain contact, a polysilicon gate contact, a source contact, and a P-body contact in sequence. In addition, the mark 207 denotes a polysilicon gate, the mark 208 denotes a field oxide, the mark 211 denotes a high-voltage deep-N-well, and a mark 212 denotes a P-substrate.

FIG. 3 is a cross-sectional diagram of an equivalent circuit of the LDNMOS transistor 104 of the ESD protection circuit 103 in FIG. 1. An N-doped region is composed of the N-type highly-doped region 201 of the drain, the N-drift region 209, and the high-voltage deep-N-well 211, a P-doped region is composed of the P-type highly-doped region and the P-body 210, and the N-type highly-doped region 202 of the source are shown in this figure, and may form a parasitic NPN bipolar junction transistor (parasitic NPN transistor) 301. In addition, the mark 302 denotes a parasitic resistor between a base of the parasitic NPN transistor 301 and the P-body contact 206.

As shown in FIG. 3, when the output pad 102 of the internal circuit signal is impacted by a negative ESD, the P-body 210 of the LDNMOS transistor 104 is connected to the common ground potential through the P-body contact 206, while the N-doped region is composed of the N-type highly-doped region 201 of the drain, the N-drift region 209, and the high-voltage deep-N-well 211, and the N-doped region is connected to a negative ESD through the drain contact 203 and the output pad 102 of the internal circuit signal successively. Therefore, a PN junction between the P-body 210 and the N-doped region is in the forward-bias state. As the P-substrate 212 is connected to the common ground potential, a PN junction between the P-substrate 212 and the N-doped region is also in the forward-bias state, so that the discharge may be achieved through the forward-bias PN junction. However, when the output pad 102 of the internal circuit signal is impacted by the positive ESD, the high current pulse injected in a short time must be discharged by triggering the parasitic NPN transistor 301 of the LDNMOS transistor 104 to enter a snapback breakdown state. The LDNMOS transistor is a kind of the high-voltage transistor, and has a high breakdown voltage. A length of a channel of the high-voltage transistor element is greater than that of a channel of a low-voltage transistor. Thus, when the ESD protection circuit 103 realized by the LDNMOS transistor 104 is impacted by the positive ESD, it is quite difficult to quickly trigger the parasitic NPN transistor 301 to enter the snapback breakdown state for discharging. As a result, the internal circuit of the chip may be burnt before the ESD protection circuit 103 is fully started.

It can be known from the above that when the power IC chip adopts the ESD protection circuit as described above, it is difficult to quickly trigger the parasitic NPN transistor of the LDNMOS transistor to enter the snapback breakdown state. Therefore, a positive ESD path cannot be formed rapidly, which results in a weak capability of power IC chip to withstand ESD.

SUMMARY OF THE INVENTION

Accordingly, the present invention is directed to provide an ESD protection circuit, having an operation speed quicker than the conventional ESD protection circuit.

The present invention is also directed to provide an ESD protection circuit, capable of achieving a high capability of the power IC chip to withstand ESD. As broadly embodied and described herein, the present invention provides an ESD protection circuit, which includes a first LDNMOS transistor, a second LDNMOS transistor, a first resistor, and a gate driving resistor. The drain of the first LDNMOS transistor is connected to an output pad of an internal circuit signal, and serves as an electrostatic input end. The P-body and source of the first LDNMOS transistor are connected to each other. According to a coupling voltage signal, it is determined whether to turn the first LDNMOS transistor on or off. The drain, P-body and gate of the second LDNMOS transistor are connected to the drain of the first LDNMOS transistor, the source of the first LDNMOS transistor, and the common ground potential, respectively. One end of the first resistor is connected to the source of the first LDNMOS transistor, and the other end of the first resistor is connected to the common ground potential. One end of the gate driving resistor is connected to the common ground potential, and the other end of the gate driving resistor is connected to the source of the second LDNMOS transistor, so as to generate the coupling voltage signal and to couple the coupling voltage signal to the gate of the first LDNMOS transistor.

As broadly embodied and described herein, the present invention further provides an ESD protection circuit, which includes an LDNMOS transistor, a high-voltage NPN transistor, a first resistor, and a gate driving resistor. The drain of the LDNMOS transistor is connected to an output pad of an internal circuit signal, and serves as an electrostatic input end. The P-body and source of the LDNMOS transistor are connected to each other. According to a coupling voltage signal, it is determined whether to turn the LDNMOS transistor on or off. The collector and base of the high-voltage NPN transistor are connected to the drain of the LDNMOS transistor and the source of the LDNMOS transistor, respectively. One end of the first resistor is connected to the source of the LDNMOS transistor, and the other end of the first resistor is connected to the common ground potential. One end of the gate driving resistor is connected to the common ground potential, and the other end of the gate driving resistor is connected to an emitter of the high-voltage NPN transistor, so as to generate a coupling voltage signal, and to couple the coupling voltage signal to the gate of the LDNMOS transistor.

In the present invention, the ESD protection circuit is realized by mainly two LDNMOS transistors (the first LDNMOS transistor and the second LDNMOS transistor), the first resistor, and the gate driving resistor. The drain of the first LDNMOS transistor is connected to the output pad of the internal circuit signal, and the P-body and the source of the first LDNMOS transistor are connected to each other. The first resistor is connected between the source of the first LDNMOS transistor and the common ground potential. The gate of the second LDNMOS transistor is grounded, and the drain and P-body of the second LDNMOS transistor are connected to the output pad of the internal circuit signal and the source of the first LDNMOS transistor, respectively. One end of the gate driving resistor is connected to the common ground potential, and the other end of the gate driving resistor is connected to the source of the second LDNMOS transistor, so as to generate the coupling voltage signal, and to couple the coupling voltage signal to the gate of the first LDNMOS transistor.

Based on the above circuit architecture, when the ESD protection circuit of the present invention is impacted by the positive ESD, once the parasitic NPN transistor of the second LDNMOS transistor is triggered, a current starts to flow through the gate driving resistor, and the gate driving resistor couples the voltage signal of the source of the second LDNMOS transistor to the gate of the first LDNMOS transistor. When a level of the coupling voltage signal exceeds a turn-on threshold voltage of the first LDNMOS transistor, the first LDNMOS transistor is instantly conducted. The current flowing through the source of the first LDNMOS transistor will flow into the common ground potential through the first resistor, and flow into the P-body of the second LDNMOS transistor, such that the current of the base of the parasitic NPN transistor of the second LDNMOS transistor is increased quickly. Therefore, the P-body trigger mode can be used to make the parasitic NPN transistor of the second LDNMOS transistor to quickly enter the snapback breakdown state to conduct larger current. At this time, the level of the coupling voltage signal will be higher, so that the first LDNMOS transistor may conduct larger current to quickly conduct the ESD current into the common ground potential. Thus, the internal circuit of the IC can be protected.

In addition, when the ESD protection circuit of the present invention is impacted by the negative ESD, the drains of the first LDNMOS transistor and the second LDNMOS transistor are in the negative potential level. The P-bodies of the first LDNMOS transistor and the second LDNMOS transistor are connected together, and then connected to the common ground potential through the first resistor. Thus, the PN junction between the P-body and the drain of the first LDNMOS transistor is in the forward-bias state, and the PN junction between the P-body and the drain of the second LDNMOS transistor is also in the forward-bias state. Further, the P-substrate of the two LDNMOS transistors are connected to the common ground potential, so the PN junction between the P-substrate and the drain is also in the forward-bias state, and thus the ESD path is formed quickly for discharging the high current pulse to the common ground potential. It can be known from the above that the ESD protection circuit impacted by no matter the positive ESD or the negative ESD may act quickly and form an effective ESD loop, so as to achieve the objective of protecting the internal circuit of the chip.

In order to make the aforementioned and other objects, features and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 4:
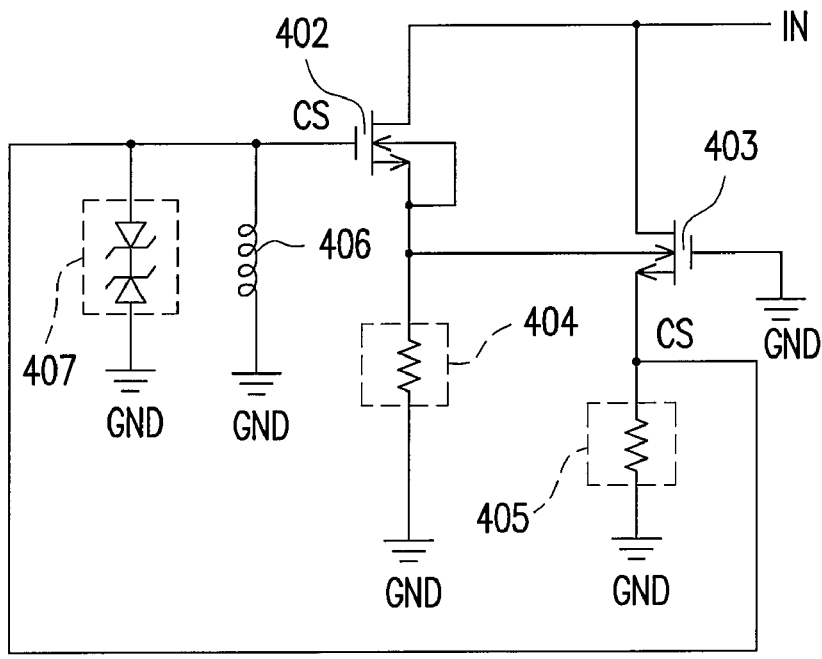
FIG. 4 is a circuit diagram of an ESD protection circuit according to an embodiment of the present invention.

FIG. 4 is a circuit diagram of an ESD protection circuit according to an embodiment of the present invention. The ESD protection circuit mainly includes a first LDNMOS transistor 402, a second LDNMOS transistor 403, a first resistor 404, and a gate driving resistor 405. The drain of the first LDNMOS transistor 402 serves as an electrostatic input end, for receiving a static electricity IN, and the P-body and source of the first LDNMOS transistor 402 are connected to each other. In addition, according to a coupling voltage signal CS, it is determined whether to turn the first LDNMOS transistor 402 on or off. The drain, P-body and gate of the second LDNMOS transistor 403 is connected to the drain of the first LDNMOS transistor 402, the source of the first LDNMOS transistor 402, and a common ground potential GND, respectively. One end of the first resistor 404 is connected to the source of the first LDNMOS transistor 402, and the other end of the first resistor 404 is connected to the common ground potential GND. One end of the gate driving resistor 405 is connected to the common ground potential GND, and another end of the gate driving resistor 405 is connected to the source of the second LDNMOS transistor 403, so as to generate a coupling voltage signal CS, and to couple the coupling voltage signal CS to the gate of the first LDNMOS transistor 402.

In addition, the ESD protection circuit further includes an inductor 406 and a voltage clamp circuit 407. One end of the inductor 406 is connected to the gate of the first LDNMOS transistor 402, and the other end of the inductor 406 is connected to the common ground potential GND. The voltage clamp circuit 407 is also connected between the gate of the first LDNMOS transistor 402 and the common ground potential GND, for clamping a voltage received by the gate of the first LDNMOS transistor 402 within a withstood voltage range (approximately 6 to 8 V) of the gate of the first LDNMOS transistor 402, so as to prevent the gate of the first LDNMOS transistor 402 from being damaged during the ESD. In this embodiment, the first resistor 404 and the gate driving resistor 405 are realized by a polysilicon resistor, and the voltage clamp circuit 407 is realized by two Zener diodes. Cathodes of the two Zener diodes are connected to each other, the anode of one Zener diode is connected to the gate of the first LDNMOS transistor 402, and the anode of the other Zener diode is connected to the common ground potential GND.

Figure 1:
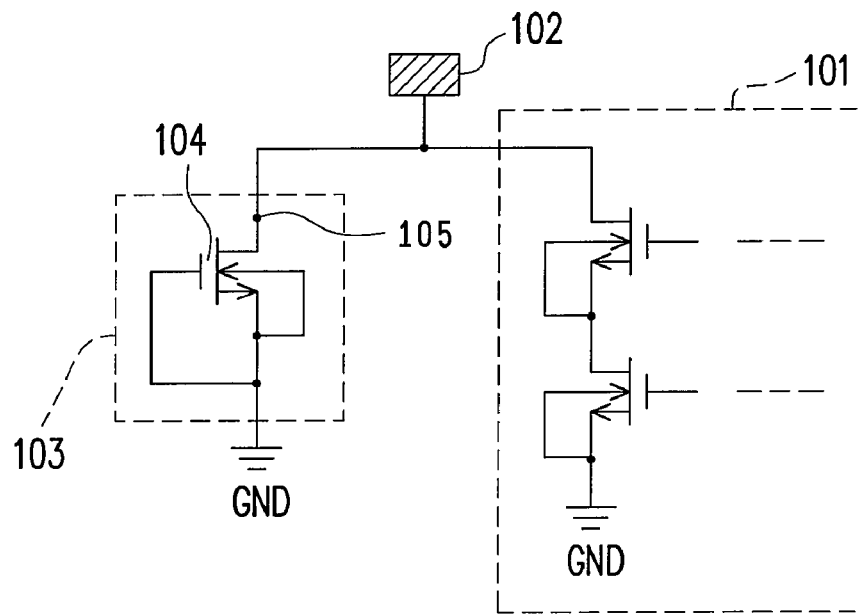
FIG. 1 is a schematic view of a conventional ESD protection circuit and a wiring mode thereof.
Figure 2:
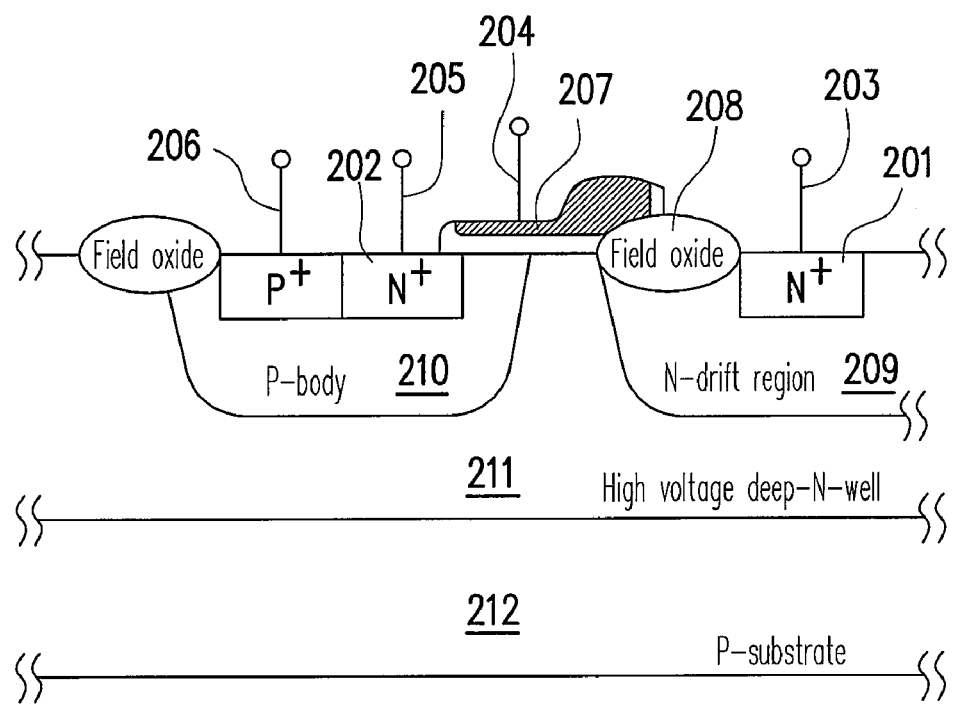
FIG. 2 is a schematic cross-sectional view of a structure of an LDNMOS transistor.
Figure 3:
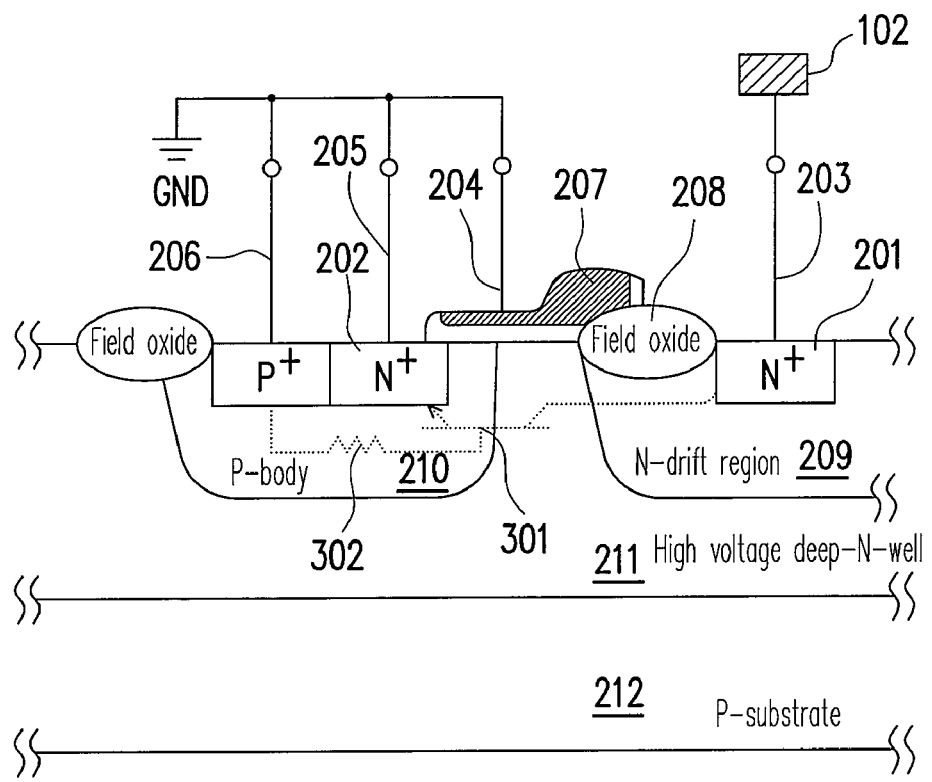
FIG. 3 is a cross-sectional diagram of an equivalent circuit of the LDNMOS transistor 104 of the ESD protection circuit 103.
Figure 5:
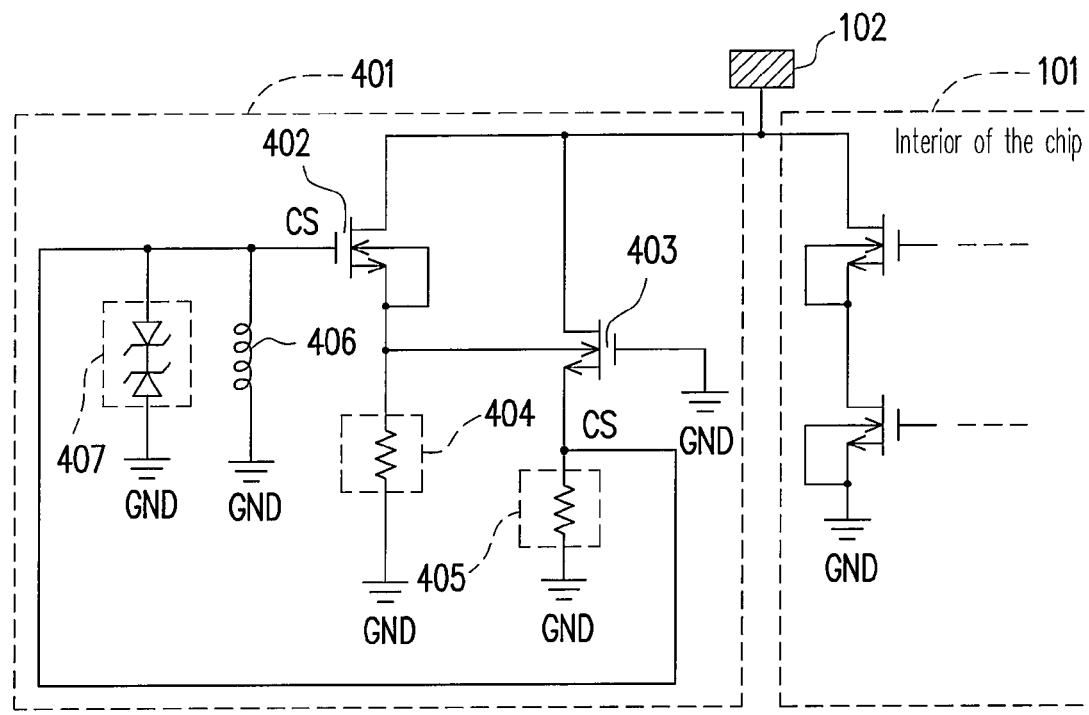
FIG. 5 is a schematic view of a wiring mode of the circuit as shown in FIG. 4.
Figure 6:
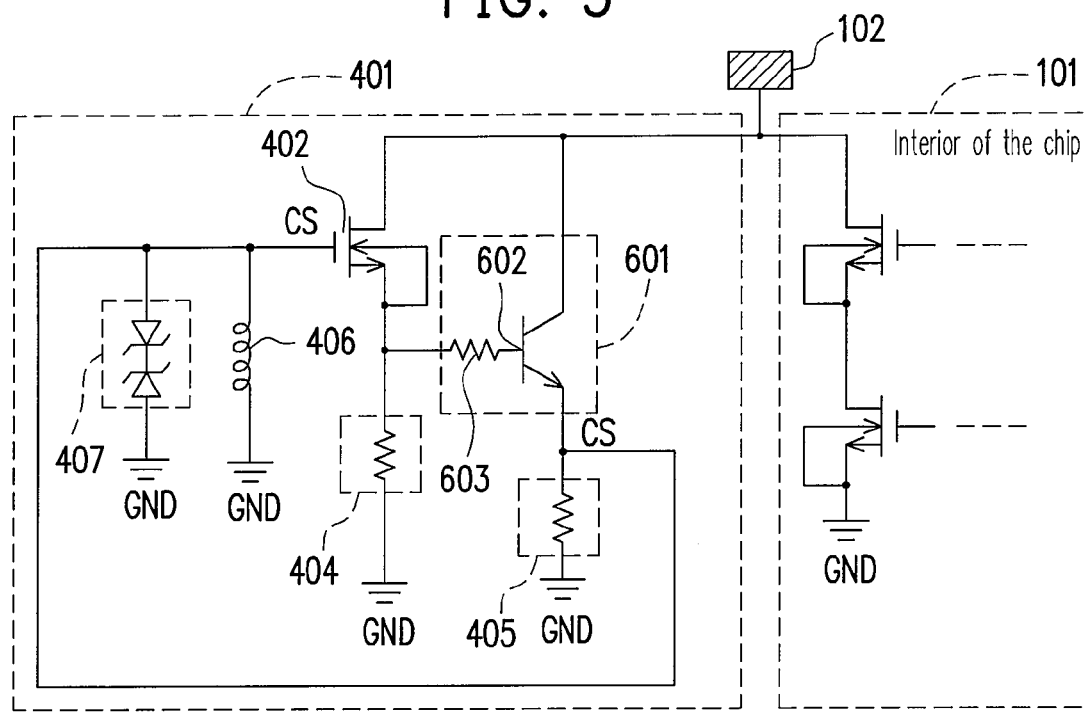
FIG. 6 is an equivalent circuit diagram of the circuit as shown in FIG. 5.

FIG. 5 is a schematic view of the wiring mode of the circuit as shown in FIG. 4. In FIG. 5, the mark 101 also denotes a part of the circuit inside the IC chip, the mark 102 denotes an output pad of an internal circuit signal, and the mark 401 denotes the ESD protection circuit of FIG. 4. Referring to FIG. 5, when the output pad 102 of the internal circuit signal is impacted by the positive ESD, the ESD protection circuit 401 uses the parasitic NPN transistor of the second LDNMOS transistor 403 to operate. For the convenience of illustration, the parasitic NPN transistor of the second LDNMOS transistor 403 is directly illustrated, as shown in FIG. 6. FIG. 6 is an equivalent circuit diagram of the circuit as shown in FIG. 5. Referring to FIGS. 5 and 6, the difference between the two drawings is that in FIG. 6, the part denoted by the mark 601 is the second LDNMOS transistor 403. That is to say, the second LDNMOS transistor 403 is directly represented by a parasitic NPN transistor 602 (as the parasitic NPN transistor 301 in FIG. 3) and a parasitic resistor 603 (as the parasitic resistor 302 in FIG. 3).

Referring to FIG. 5 again, the gate of the first LDNMOS transistor 402 is connected to the common ground potential GND through the inductor 406 and the gate driving resistor 405, and the gate of the second LDNMOS transistor 403 is also connected to the common ground potential GND. Thus, under the condition that the IC chip operates normally, when the signal is transmitted through the output pad 102 of the internal circuit signal, the inductor 406 and the gate driving resistor 405 may transfer the noise coupled to the gate of the first LDNMOS transistor 402 to the common ground potential GND, so as to ensure that the first LDNMOS transistor 402 and the second LDNMOS transistor 403 are in the off state.

When the output pad 102 of the internal circuit signal is impacted by the negative ESD, the forward-bias junctions of the first LDNMOS transistor 402 and the second LDNMOS transistor 403 can be directly used for discharging. When the output pad 102 of the internal circuit signal is impacted by the positive ESD, the reverse bias of the junction between the drain and P-body of the first LDNMOS transistor 402 and the reverse bias of the junction between the drain and P-body of the second LDNMOS transistor rise quickly, which promotes the avalanche breakdown of the junctions between the drains and P-bodies of the two LDNMOS transistors. Consequently, the levels of the P-bodies of the two LDNMOS transistors rise quickly, which further triggers the parasitic NPN transistors of the two LDNMOS transistors.

Referring to FIG. 6, once the parasitic NPN transistor 602 of the second LDNMOS transistor 403 is turned on, an emitter current of the parasitic NPN transistor 602 causes the raise of the voltage drop of the gate driving resistor 405. The voltage drop obtained after the emitter current flowing through the gate driving resistor 405 serves as the coupling voltage signal CS, and is coupled to the gate of the first LDNMOS transistor 402. During the period, the inductor 406 acts as an energy storage element, so that the gate voltage of the first LDNMOS transistor 402 changes in accordance with the coupling voltage signal CS.

When the gate voltage of the first LDNMOS transistor 402 exceeds the turn-on threshold voltage of the LDNMOS transistor, the first LDNMOS transistor 402 is turned on. At this time, the ESD protection circuit 401 does not rely on a self-biasing mode, but injects a part of the source current of the turn-on first LDNMOS transistor 402 into the base of the parasitic NPN transistor 602 to promote the parasitic NPN transistor 602 to enter the snapback breakdown state faster, so as to perform the ESD. The larger base current of the parasitic NPN transistor results in a larger emitter current, and the coupling voltage signal CS received by the gate of the first LDNMOS transistor 402 is larger, so that the source current of the first LDNMOS transistor 402 becomes larger. Therefore, the current injected into the base of the parasitic NPN transistor 602 is larger, and naturally the parasitic NPN transistor 602 enters the snapback breakdown state quickly. In brief, the ESD protection circuit 401 adopts a P-body trigger manner to accelerate the turn-on of the parasitic NPN transistor 602, and couple the coupling voltage signal CS to the gate of the first LDNMOS transistor 402, so as to accelerate the turn-on of the first LDNMOS transistor 402 to form the discharge path to assist discharging. Further, the parasitic NPN transistor 602 can enter the snapback breakdown state for discharging faster.

In this manner, when the positive level static electricity causes impacts on the internal circuit of the chip through the output pad 102 of the internal circuit signal, the ESD protection circuit 401 may quickly form the discharge loop, such that the high current pulse injected into the output pad 102 of the internal circuit signal in a short time can be quickly discharged to the common ground potential GND. It is known from the above that no manner the output pad 102 of the internal circuit signal is impacted by the positive ESD or the negative ESD, the ESD protection circuit 401 may act quickly and form the effective ESD path, thus achieving the objective of protecting the internal circuit of the chip.

Although in the above embodiment, the LDNMOS transistor is illustrated as an example, those skilled in the art would appreciate that although the LDPMOS transistor is adopted, the present invention can also be implemented. In addition, the first resistor 404 and the gate driving resistor 405 are implemented by the polysilicon resistor or an N-well parasitic resistor, and the resistors may be disposed on the LDNMOS transistor according to the practical design requirements. Definitely, the implementing manner of the resistor is only illustrated as an example, and the present invention is not limited to this. It should be noted that the parasitic NPN transistor 602 may also be realized by a common high-voltage NPN transistor. The operation manners can be deduced by users from the above similar operation manners, so it will not be described herein again.

To sum up, the present invention mainly adopts the first LDNMOS transistor, the second LDNMOS transistor, the first resistor, and the gate driving resistor to realize the ESD protection circuit. The drain of the first LDNMOS transistor is connected to the output pad of the internal circuit signal, and the P-body and the source of the first LDNMOS transistor are connected to each other. The first resistor is connected between the source of the first LDNMOS transistor and the common ground potential. The gate of the second LDNMOS transistor is grounded. The drain and P-body of the second LDNMOS transistor are connected to the drain of the first LDNMOS transistor and the source of the first LDNMOS transistor, respectively. One end of the gate driving resistor is connected to the common ground potential, and the other end is connected to the source of the second LDNMOS transistor, so as to generate a coupling voltage signal and to couple the coupling voltage signal to the gate of the first LDNMOS transistor. Therefore, when the ESD protection circuit of the present invention is impacted by the negative ESD, the forward-bias junction between the P-body and the drain of the LDNMOS transistor and the forward-bias junction between the P-substrate and the drain are used to discharge. When being impacted by the positive ESD, the present invention couples the coupling voltage signal to the gate of the first LDNMOS transistor, so as to accelerate the turn-on of the first LDNMOS transistor. The P-body trigger manner is used to accelerate the parasitic NPN transistor of the second LDNMOS transistor to enter the snapback breakdown state, so as to quickly form the ESD path to further conduct the ESD current into the common ground potential. The ESD protection circuit impacted by no matter the positive ESD or the negative ESD can act quickly and form an effective ESD loop, thus achieving the objective of protecting the internal circuit of the chip.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electrostatic discharge (ESD) protection circuit comprising:
    a first LDNMOS transistor, having a drain served as an electrostatic input end, and a P-body and a source of the first LDNMOS transistor are connected to each other, wherein a coupling voltage signal determines whether the first LDNMOS transistor is turned on or not;
    a second LDNMOS transistor, having a drain connected to the drain of the first LDNMOS transistor, a P-body connected to the source of the first LDNMOS transistor, and a gate connected to a common ground potential;
    a first resistor, having one end connected to the source of the first LDNMOS transistor, and the other end connected to the common ground potential; and
    a gate driving resistor, having one end connected to the common ground potential, and the other end connected to the source of the second LDNMOS transistor, so as to generate the coupling voltage signal, and to couple the coupling voltage signal to the gate of the first LDNMOS transistor.

2. The ESD protection circuit as claimed in claim 1, wherein the first resistor and the gate driving resistor are implemented by a polysilicon resistor or an N-well parasitic resistor.

3. The ESD protection circuit as claimed in claim 1, further comprising an inductor, having one end connected to the gate of the first LDNMOS transistor and the other end connected to the common ground potential.

4. The ESD protection circuit as claimed in claim 1, further comprising a voltage clamp circuit connected between the gate of the first LDNMOS transistor and the common ground potential, for clamping a voltage received by the gate of the first LDNMOS transistor within a withstood voltage range of the gate of the first LDNMOS transistor.

5. The ESD protection circuit as claimed in claim 4, wherein the voltage clamp circuit comprising:
    a first Zener diode, having an anode connected to the gate of the first LDNMOS transistor; and
    a second Zener diode, having a cathode connected to a cathode of the first Zener diode and an anode connected to the common ground potential.

6. An ESD protection circuit comprising:
    an LDNMOS transistor, having a drain served as an electrostatic input end, and a P-body and a source of the LDNMOS transistor are connected to each other, wherein a coupling voltage signal determines whether the LDNMOS transistor is turned on or not;
    a high-voltage NPN transistor, having a collector connected to the drain of the LDNMOS transistor and a base connected to the source of the LDNMOS transistor;
    a first resistor, having one end connected to the source of the LDNMOS transistor and the other end connected to a common ground potential; and
    a gate driving resistor, having one end connected to the common ground potential and the other end connected to an emitter of the high-voltage NPN transistor, so as to generate the coupling voltage signal, and to couple the coupling voltage signal to the gate of the LDNMOS transistor.

7. The ESD protection circuit as claimed in claim 6, wherein the first resistor and the gate driving resistor are implemented by a polysilicon resistor or an N-well parasitic resistor.

8. The ESD protection circuit as claimed in claim 6, further comprising an inductor, having one end connected to the gate of the LDNMOS transistor and the other end connected to the common ground potential.

9. The ESD protection circuit as claimed in claim 6, further comprising a voltage clamp circuit connected between the gate of the LDNMOS transistor and the common ground potential, for clamping a voltage received by the gate of the LDNMOS transistor within a withstood voltage range of the gate of the LDNMOS transistor.

10. The ESD protection circuit as claimed in claim 9, wherein the voltage clamp circuit comprising:
    a first Zener diode, having an anode connected to the gate of the LDNMOS transistor; and
    a second Zener diode, having a cathode connected to a cathode of the first Zener diode and an anode connected to the common ground potential.

* * * * *